United States Patent
Rayssac

(10) Patent No.: US 7,056,809 B2
(45) Date of Patent: Jun. 6, 2006

(54) METHOD FOR ION TREATING A SEMICONDUCTOR MATERIAL FOR SUBSEQUENT BONDING

(75) Inventor: Olivier Rayssac, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 173 days.

(21) Appl. No.: 10/695,938

(22) Filed: Oct. 30, 2003

(65) Prior Publication Data

US 2004/0092084 A1      May 13, 2004

(30) Foreign Application Priority Data

Oct. 30, 2002   (FR)   .................................... 02 13582

(51) Int. Cl.
*H01L 21/30*   (2006.01)
(52) U.S. Cl. ...................................... 438/458; 438/455
(58) Field of Classification Search ................ 438/455, 438/458, 463
See application file for complete search history.

(56) References Cited

U.S. PATENT DOCUMENTS

| | | | |
|---|---|---|---|
| 4,990,994 A * | 2/1991 | Furukawa et al. .......... | 257/763 |
| 5,869,354 A | 2/1999 | Leedy ......................... | 438/110 |
| 6,153,495 A | 11/2000 | Kub et al. .................. | 438/459 |
| 6,180,496 B1 | 1/2001 | Farrens et al. .............. | 438/455 |
| 6,190,778 B1 | 2/2001 | Batz-Sohn et al. .......... | 428/448 |
| 2002/0014407 A1 | 2/2002 | Allen et al. ............. | 204/298.36 |
| 2002/0139772 A1 | 10/2002 | Fenner ........................ | 216/60 |
| 2004/0112866 A1 * | 6/2004 | Maleville et al. ............. | 216/83 |
| 2005/0042800 A1 * | 2/2005 | Yamada et al. ............. | 438/105 |

FOREIGN PATENT DOCUMENTS

| | | |
|---|---|---|
| FR | 2 823 596 | 10/2002 |
| FR | 2 823 599 | 10/2002 |
| WO | WO 99/10927 | 3/1999 |
| WO | WO 01/61743 | 8/2001 |

* cited by examiner

*Primary Examiner*—Bradley K. Smith

(74) *Attorney, Agent, or Firm*—Winston & Strawn LLP

(57) ABSTRACT

The invention relates to a manufacturing process of detachable substrates, the said process comprising a surface condition adjustment treatment of at least one of two layers of material, followed by the reversible bonding of the surfaces of the two layers to make the detachable substrate, characterised in that the said surface condition adjustment treatment comprises the bombardment of the surface to be treated with ion clusters.

19 Claims, 2 Drawing Sheets

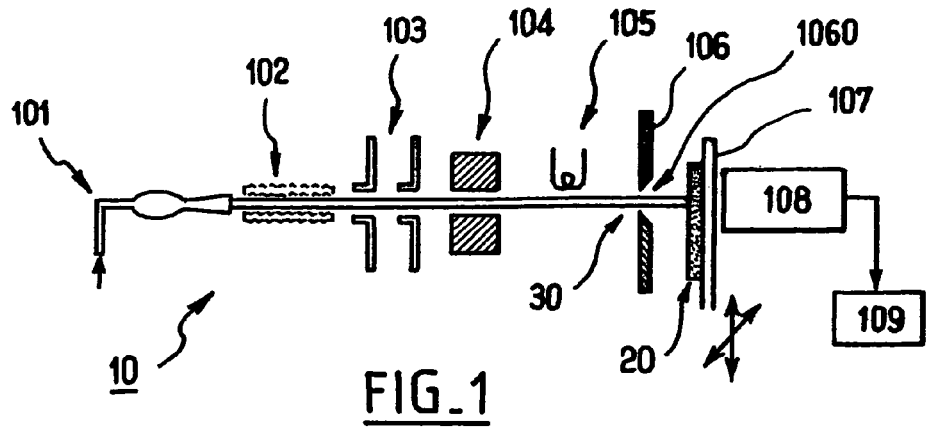
FIG_1
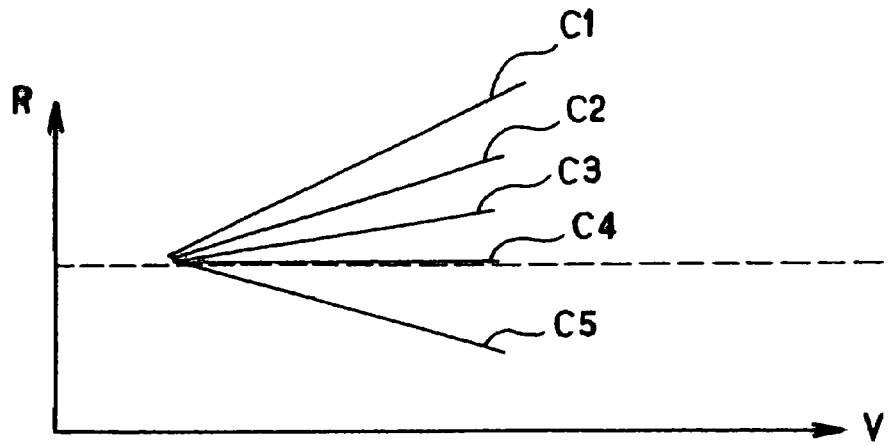
FIG_2a
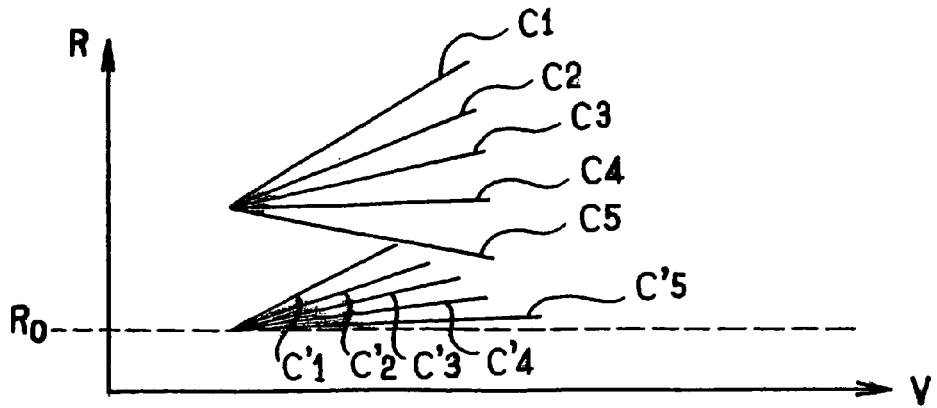
FIG_2b

METHOD FOR ION TREATING A SEMICONDUCTOR MATERIAL FOR SUBSEQUENT BONDING

This invention relates to the treatment of materials in general, and in particular of substrates for electronics, optics and optoelectronics.

More precisely, the invention relates to a manufacturing process of detachable substrates, the said process comprising a surface condition adjustment treatment of at least one of two layers of material, followed by the reversible bonding of the surfaces of the two layers to constitute the detachable substrate.

Processes of the aforementioned type are already known.

These processes allow for the making, from two layers of material—for example semiconductor materials such as silicon—of so-called "detachable" substrates.

The expression "detachable" substrate designates a substrate that comprises two layers that have been bonded together, this bonding being reversible so that it is possible to separate the two layers along their bonding interface.

Detachable substrates thus comprise two layers made integral via a bonding interface in which the cohesion energy between the two layers is controlled so as:
  to be sufficiently great to guarantee good cohesion of the two layers forming the detachable substrate, even when this substrate is subject to thermal and/or mechanical treatments (for example thermal treatments such as high temperature annealing, mechanical treatments such as overhauling of the substrate surface),
  whilst remaining sufficiently small to offer an embrittlement zone between the two layers forming the detachable substrate, so that these two layers can be disjoined if desired (for example after the substrate has been subject to the aforementioned treatments). Typically the two layers of the detachable substrate are disjoined via a mechanical action, for example an attack by an object such as a blade.

By way of reminder, it is specified that "bonding" within the context of treatment of very thin layers as in the case of the invention, corresponds to putting into intimate contact two layers, so as to favour the creation of links, via molecular adhesion, between the bonded surfaces of the two layers.

These links may typically be hydrogen links in which the development can be stimulated via a pre-treatment of the layers that are to be bonded.

This pre-treatment, applied prior to bonding, can for example comprise a cleaning stage consisting in dipping the layers successively in:
  at least an alkaline bath. The purpose of the stage is to develop the hydrophily of the layers, by creating on the surface of the said layers OH type links.
  then an acid bath, in order to eliminate from the surface of the layers any contaminating elements (in particular metals) that may have been brought about during the previous treatments of the layers (and in particular the alkaline bath).

The pre-treatment can also involve exposing the layers to a plasma for example, or other techniques known in this regard.

Moreover, it is specified that the surface condition of the layers to be bounded is, in the case of layers of material used in the manufacturing of substrates for electronics, optics or optoelectronics, subject to very strict specifications.

It is thus common to have specifications concerning roughness which must not exceed a few Angstroms in rms value (root mean square).

It is specified that roughness is generally measured with an AFM (Atomic Force Microscope).

With this type of equipment, roughness is measured on surfaces being scanned by the tip of the AFM, ranging from $1\times1$ µm$^2$ to $10\times10$ µm$^2$ and more rarely $50\times50$ µm$^2$, even $100\times100$ µm$^2$.

And due to the surface condition of these layers, which is generally very smooth, the bonding of the layers is simply done by putting into contact the surfaces of the two layers—this putting into contact possibly being complemented with a compression of the structure made of the two layers.

Now going back to the particular case of detachable substrates, it is thus known to make such substrates by applying to the surface, of at least one of the two layers to be bonded, a surface condition adjustment treatment.

More precisely, such a surface condition adjustment treatment consists in applying to the surface to be treated a so-called "humid" etching, that meaning putting the surface into contact with a liquid capable of attacking it, so as to adjust its roughness.

For example, the surface to be treated may be an oxide, and the liquid may be hydrofluoric acid.

The oxide of the surface may be in particular a silicon dioxide. Indeed it is specified that a preferred yet not restrictive application of the invention relates to the treatment of substrates comprising a layer of semiconductor material such as silicon.

And attacking the surface with the liquid allows for the modifying as desired of the surface condition—in the present case to increase its roughness to a desired level, corresponding to a surface condition which, admittedly enables the bonding with another layer, but also allows for the undoing of this bonding later on, via a mechanical action.

The desired roughness (typically a roughness of about 5 Angstroms rms to make a detachable substrate) is achieved by controlling in particular the length of time the surface to be treated is exposed to the liquid.

Thus, the known techniques to make detachable substrates by a liquid, in order to increase the roughness of this surface.

And an inconvenience relative to these known techniques to make detachable substrates is that some parts of the layer to be treated that should not be attacked may happen to be exposed to the liquid.

Consequently, in the case of a layer of which only one side is to be treated, the opposite side of the layer may happen to be considerably attacked by the liquid.

Admittedly it is possible to plan for additional means to protect certain parts of the layer during humid etching.

It is thus possible to plane of these parts to be covered with a protective elements, for example a varnish.

However this implies the use of specific and complex equipment.

Moreover, such means do not necessarily make it possible to systematically prevent the liquid from attacking certain parts (notably the lateral parts of the layer).

And the implementing of such means implies additional handling of the layers, and thus additional risks of damaging these layers (which may be extremely fragile, particularly in the case of thin layers as mentioned above).

Moreover, if the purpose is to control the spatial distribution of the regions of a side of a layer whose roughness is to be adjusted via the known techniques of humid etching, it is necessary to plan for relatively heaving and complex means and protocol in order to etch only the desired regions of the said side.

Indeed in this case it is necessary to cover the side of the layer of which some regions are to be etched, with a mask forming a spatial pattern which keeps free either only the regions of the layer which are to be etched (positive mask), or only the regions which are to be protected from etching (negative mask).

It is the structure made of the layer to be etched and its mask that is exposed to the humid etching. It is then necessary to remove the mask. This is achieved via chemical products and/or via the exposure to a plasma.

And such means to remove the mask are likely to damage the surface of the layer, and/or leave some contaminating elements on this surface.

Such contaminating elements can in particular be hydrocarbons issued from the resin having formed the mask—such hydrocarbons then constitute an obstacle to the bonding of the layer via molecular adhesion, this rendering the manufacturing of a detachable substrate from such a layer difficult.

Thus it appears that the known solutions to make detachable substrates have limitations.

A purpose of the invention is to allow for the removal of these limitations.

Another purpose of the invention is to allow for the precise controlling of the surface condition (and in particular the roughness) of layers that are to be assembled to make a detachable substrate.

In particular, it would be desirable to be able to finely adjust this surface condition, with the possibility of either selectively increasing or reducing the roughness of the surface of such layers.

Still another purpose of the invention is to allow for the local adjusting of the surface of a layer in semiconductor material, according to a set spatial pattern, without being subject to the aforementioned inconveniences.

In order to reach these goals, the invention proposes a manufacturing process of detachable substrates, the said process comprising a surface condition adjustment treatment of at least one of two layers of material, followed by the reversible bonding of the surfaces of the two layers to make the detachable substrate, characterised in that the said surface condition adjustment treatment comprises the bombardment of the surface to be treated with clusters of at least one defined species.

Here are some preferred yet not restrictive aspects of the process according to the invention:

the bombarded ions comprise species that are chemically inert in relation to the surface of be treated, the layer of material whose surface condition is to be adjusted is made of silicon or of silicon carbide, and the bombarded ions are argon or nitrogen ions.

the said ions comprise ions that are capable of chemically reacting with the material of the surface to be treated, the bombardment is carried out from a plasma containing the said ions, the materials of the surface to be treated and the element making the plasma form one of the following pairs: (Si, $SF_6$), (SiC, $SF_6/O_2$), ($SiO_2$, $SF_6/O_2$), ($SiO_2$, $CHF_3/SF_6$), ($Si_3N_4$, $CHF_3/O_2/SF_6$), the process comprises the control of the number of ions in the clusters for the adjusting of the roughness of the surface to be treated, either with the aim of increasing or reducing this roughness, the said control is carried out so as to smoothen the said surface to bring its roughness to a value that enables bonding via molecular adhesion, the surface is a negative surface of a SMARTCUT® type process that is recycled, the said control of the number of ions is achieved via the control of the pressure of an ion source allowing the generating of ion clusters, the process also comprises the control of the bombardment voltage applied to the ions, the surface to be treated is selectively and locally treated in desired zones by selectively directing towards the zones to be treated the beam of ion clusters, so as to create on this surface a pattern according to which the surface condition is selectively adjusted in the desired manner, a focalised beam is created, comprising the ions to be bombarded as well as the monomer species of these ions, and the part of the beam comprising the ion clusters is directed towards the layer, the impact site of the said beam of ion clusters on the layer is controlled, an appropriate spatial pattern is created on the surface of the layer, with a roughness that is adjusted in comparison with that of the rest of the surface of the layer, and patterns with variable roughness are created on the surface of the layer, Other aspects, aims and advantages of the invention will become clearer upon reading the following description, in view of the embodiments of the invention, in reference to the annexed drawings in which:

FIG. 1 is a schematic diagram of an installation allowing the bombardment with ion clusters, FIGS. 2*a* and 2*b* are graphs schematically representing the evolution of the roughness of a surface subject to a bombardment with ion clusters, under different bombardment conditions, FIG. 3 is a histogram illustrating the influence of the pressure associated to the generating of the ions, on the number of ions present in the clusters (it is specified that this histogram is issued from the article "Materials processing by gas cluster ion beams", Material Science and Engineering, R34, No6, p244 (2001)), FIGS. 4*a* to 4*c* illustrate a particular implementation method of the invention, in which a surface is selectively and locally treated so as to adjust its surface condition according to a desired pattern.

Now in reference to FIG. 1, it schematically represents an installation 10 allowing the bombarding of a layer 20 of material with a beam 30 of ion chemistry.

Here the word "ions" can designate ions that are themselves "pure", but also species created from several ions and which are electrically charged.

Generally speaking, the "clusters" which will be spoken of below are globally ionised, that meaning that they have an electric charge other than 0. However, generally speaking these clusters can further comprise ions of other species, including molecules.

The layer 20 is of semiconductor material. As will be explained below, it can either be of silicon or of silicon carbide, or of another semiconductor material (SiO2 or Si3N4 for example.

The installation 10 comprises a source 101 of pressurised gas, capable of generating a parallel beam of gas ion clusters from a plasma that is internal to the source 101.

It is specified that the control of the characteristics of this plasma allows for the defining of the configuration of the ion clusters, more precisely, the control of the pressure of the plasma of the source 101 allows for the controlling of the average number of ions present in the clutches, as will be detailed in reference to FIG. 3.

And the control of the acceleration voltage allows for the controlling of the speed of these clusters.

The gas used can for example be argon or nitrogen.

The layer 20 corresponds to a layer whose surface condition is to be modified in a controlled manner in order to then assemble it, via bonding, with another layer (whose surface condition may also have been adjusted) so as to constitute a detachable substrate.

According to a first alternative to the invention, ion clusters such as those described above are thus projected onto the surface of the layer 20, this bombardment comprising no chemical reactions.

In this cage the bombardment is said to be purely "ballistic", the bombarded clusters being chemically inert in relation to the material of the layer 20.

In this case, the bombarded clusters are typically made from argon or nitrogen.

According to another alternative to the invention, it is possible to bombard clusters of ions of a species, capable of chemically reacting with the material of the layer 20.

In this case the bombardment is said to be reactive.

And in this case, the bombarded ions can in particular be of oxygen or an oxygen compound.

In this case which includes a reactive bombardment, it is also possible to further plan for an etching plasma (different from the plasma of the source 101) in a zone of the device 10 through which the ion beam will need to pass and which is located in the region of the device 10 that is immediately upstream from the layer 20.

In this particular embodiment of the invention, which includes an etching plasma, it can for example be planned that the material of the layer 20 and the element making this plasma constitute one of the following pairs: (Si, $SF_6$), (SiC, $SF_6/O_2$), ($SiO_2$, $SF_6/O_2$), ($SiO_2$, $CHF_3/SF_6$), ($Si_3N_4$, $CHF_3/O_2/SF_6$).

In this case, the ion clusters created by the source 101 chemically react with the etching plasma.

And the etching plasma itself can also chemically react with the surface of the layer, as well as the species having passed through the etching plasma with the layer itself.

Going back to the description of the installation 10, the ion beam thus generated by the source 101 then passes through an accelerating chamber 102, which allows for the accelerating in the desired manner of the ion clusters of the beam issued from the source 101, thanks to an acceleration electric voltage to which it is possible to give a desired value.

It is specified that in this text the "acceleration voltage" of the source 101 actually corresponds to the acceleration voltage of this accelerating chamber 102.

This beam then passes through a beam-creating electromagnetic structure 103 which allows for the adjusting of the characteristics of the magnetic field of the beam (collimation, focalisation . . . ), via the application of electromagnetic fields with desired characteristics.

The beam then passes through a magnet annular structure 104 which also allows for the creation of a field with controlled characteristics, in order to selectively deviate the charged species of the ion beam.

Indeed it is specified that the beam issued from the accelerating chamber 102 and the electromagnetic structure 103 comprises ion clusters of the bombarded species, but also molecules which are electrically neutral (in particular monomers of the bombarded species).

The trajectory of the different elements of this beam is represented as being strictly rectilinear on the schematic representation in FIG. 1.

Actually, these trajectories are not rectilinear, the radius of curvature of the trajectory depending on the mass of the ions and of the different elements of the beam.

Any by precisely controlling the characteristics of the magnetic field generated by the magnet annular structure 104, it is possible to selectively deviate only the desired ion clusters towards the opening of a screen 106, as the other constituents of the beam do not pass through this opening, being stopped by the screen 106.

It is specified that the structure 103 and the structure 104 can be one and the same.

An electrical neutralising structure 105 is also provided.

A screen 106 with an opening 1060 is, as has been said, positioned so as to only let through the part of the beam that comprises the desired clusters, so that the latter can have an impact on the layer 20 located behind the opening 1060.

The screen 106 and its opening 1060 constitute fixed parts of the device.

And the part of the beam which passes through this opening to have impact on the layer 20 corresponds to a focalised beam, following the passing through of the means 103.

Hence, the layer 20 only receives the impact of the beam of ion clusters over a basic surface of very small dimensions (the section of the beam passing through the opening 1060 has a width of about one or a few millimeters).

As for the layer 20, it is mounted on a movable support 107 whose displacements within the plane perpendicular to the beam, are controlled.

It is thus possible to define with great precision an etching pattern of the ion clusters on the surface of the layer 20, by displacing this layer according to a desired trajectory using the means 107, so that the impact site of the ion clusters on the layer 20 traces a special pattern. This aspect will be further considered later.

A screened room 108 is located behind the layer 20 and the means of displacement 107, facing the impact zone of the beam on the layer 20.

This screened room 108 is connected to means 109 of determining the dose of species received by the layer 20.

The bombardment of the layer 20 with ion clusters of desired characteristics thus allows for the adjusting of the roughness of the surface of this layer, in view of constituting a detachable substrate.

It is to be noted that, in comparison with the known techniques to modify the surface condition via humid etching, the bombardment with ion clusters does not present the inconveniences described in the introduction of this text.

In particular, no "leak" of contamination is to be feared as, first of all, the technique used here to modify the roughness of the surface of the layer belongs to "dry" etching techniques, and not "humid": here the layer 20 does not come into contact with liquids.

Moreover, the bombardment technique with ion clusters used in the context of this invention allows, as has been said, to very precisely control the impact zone of the ion clusters on the layer 20.

This remains true even in the case where the layer is not displaced, as the dimensions of the section of the beam that has impact on the layer are very small, as already mentioned.

And the fact of carrying out this bombardment not simply with ions but with clusters of ions, allows for great freedom in the adjusting of the surface roughness of the layer 20.

More precisely, it is possible to selectively reduce, or increase, the surface roughness of the layer 20.

Indeed it has been observed that, depending on the characteristics of the bombardment with ion clusters, it is possible to either increase or reduce this roughness.

More precisely, in reference to FIG. 2a, it schematically represents several curves C1 to C5 substantially rectilinear, that translate the evolution of the roughness R of the surface of the layer 20, versus the evolution of the voltage V applied to the beam inside the accelerating chamber 102.

Each of these curves in FIG. 2a corresponds to a bombardment condition in which the ion clusters mainly comprise a respective number of ions.

Indeed, the control of the bombardment parameters allows to determine the number of ions present in the clusters bombarded on the layer 20.

It is specified that the main parameter that controls the number of ions present in the clusters is the pressure inside the ion source 101.

Thus, by controlling this pressure of the source 101, the number of ions in the clusters is also controlled.

This is illustrated on the histogram in FIG. 3.

Indeed this figure represents several curves A1, A2, A3, A4.

Each of these curves represents the size repartition of the ion clusters, for a given pressure of the source.

The size of the clusters is represented by the number of atoms per cluster (upper horizontal scale), which here varies from 0 to 3000 atoms per cluster.

The lower curve A1 is associated with a pressure of 760 Torr, the curve A2 with a pressure of 2300 Torr, the curve A3 with a pressure of 3000 Torr, the curve A4 with a pressure of 3800 Torr.

It can be observed that the peak of these curves—which corresponds to the most common cluster size for the pressure in question—has greater values as the pressure increases.

Hence it can be observed that the number of ions present in each cluster lies around an average number of ions per cluster, this average number being designated N.

And it is thus possible, by controlling the pressure of the ion source, to control this value of N.

Each curve in FIG. 2a thus corresponds to a different value of N: the value of N increases when changing curve, from C1 to C2, to C3, to C4, to C5.

The curve C1, the highest, corresponds to a bombardment with individual ions, that meaning under conditions where N equals 1.

Under these conditions, it can be observed that, as the acceleration voltage of the ions of the beam increases, the surface roughness of the layer 20 subject to the bombardment with "clusters" each made of a single ion, increases considerably.

Indeed under these bombarding conditions, the ions individually bombarded on the layer provoke major damage to the surface structure of the layer.

The curve C2, immediately below the first curve, corresponds to bombardment conditions under which N has a value greater than 1.

In this case it can be observed that the same increase in acceleration voltage does not result in as great an increase of the surface roughness, even though this roughness increases.

The next curve C3 illustrates a low increase of the roughness for the same increase in the voltage V.

And the curve C4, which corresponds to bombardment conditions under which the bombarded clusters comprise a rather large number of ions, illustrates a constant roughness despite the increase in the acceleration voltage V.

Indeed, when the ion clusters comprise a number N of ions greater than a given threshold, the slope of the evolution curves Rf(V) becomes nil, under certain conditions. This threshold notably depends on the starting surface condition of the layer, prior to bombardment.

And when the number N continues to increase, the bombardment does not increase the surface roughness of the layer 20, but rather reduces it by smoothing this surface.

This incidence is illustrated by the curve C5.

By adjusting the bombardment conditions—and more precisely the number of ions present in the clusters—it is thus possible to adjust in the desired manner the surface condition of the layer 20:

by increasing to a greater or lesser extent the surface roughness of this layer, or even by reducing this roughness. This is useful in the cases where the surface of the layer 20 has a high roughness at the start of bombardment.

It thus appears that two parameters defining the bombardment condition shave a major influence on the progression of the process:

the pressure associated with the generating of the ions allows for the controlling of the number of ions present in the clusters, the acceleration voltage allows for the controlling of the speed of the clusters, and also has an influence as described in reference to FIGS. 2a and 2b.

This influence can be exploited by programming bombardment sequences during which different regions of the layer 20 are subject to bombardments with clusters comprising different numbers of ions, so as to selectively adjust in a desired manner the surface roughness of these different regions.

For this purpose, the means of displacement 107 will be programmed to displace the layer 20 in conjunction with changes to the parameters allowing to modify the value of N, during the different successive stages of a given bombardment of the layer.

Now in reference to FIG. 2b, it again represents the evolution of the surface roughness R of the layer 20 subject to a bombardment with ion clusters comprising an average number N of ions which can vary (here again corresponding to different curves in this figure), versus the acceleration voltage V.

This figure includes the curves C1 to C5 of FIG. 2a.

However FIG. 2b also shows another set of curves C'1 to C'5, which evolve according to the same general logic as the curves C1 to C5 (increase the number N from curve C'1 to C'5, for the same starting layer 20 and the same bombardment ions).

It can be observed on the curves C'1 to C'5 that, contrary to the curves C1 to C5, the increase in the number N does not result in a reduction of the surface roughness of the layer 20.

It is specified that the curve C'5 corresponds to a number N that is very large, which can be assimilated with an infinite value of N.

It can be noted that when the surface condition of the layer 20 already corresponds to a low roughness (curves C'1 to C'5), it becomes impossible to smoothen the surface of this layer by increasing N.

Hence, starting with a layer whose surface roughness is relatively important, it is possible to selectively increase, or reduce, this roughness.

An interesting application of this consists in using as layer 20 wafers whose surface condition is incompatible with bonding via molecular adhesion (roughness greater than a value of about 5 Angstroms rms), to treat certain regions of these wafers so as to smoothen them and bring their roughness to a value that enables such bonding.

In particular this allows for the recycling of negatives issued from a SMARTCUT® type process, by reusing them.

And still in this case, it is possible to use layers constituted from a wafer whose intrinsic surface condition is incompatible with bonding (SiC, III-V). Instead of proceeding with the complete polishing of such a wafer, a bombardment with clusters comprising a rather large number N of ions will make it possible to smoothen the surface of the wafer.

Moreover, this smoothing can be very precisely controlled, both in terms of final roughness and in terms of creating a spatial pattern with more or less smooth regions in view of bonding.

However if the starting surface condition of the layer 20 is inferior to a given threshold $R_0$ (which depends among other things on the nature of the material of the layer and of the bombarded species), it will only be possible to increase this roughness.

Indeed, if the starting point of the curves C'1 to C'5 happened to be below the threshold $R_0$ (whereas it is situated at the level of this threshold in FIG. 2b), it would not even be possible to retain this starting low roughness by proceeding with a bombardment of the surface: even a bombardment with a very great value of N would result in an increase of the roughness.

Now in reference to FIGS. 4a to 4c, they schematically represent layers 20 having been subject to a bombardment with ion clusters such as described above, during which the roughness of certain regions of the surface of the layer has been selectively modified.

FIG. 4a thus represents a layer on the surface of which a ring has been created with a roughness lower than that of the rest of the surface, so as to obtain a greater mechanical stability on this ring at the time of assembling the layer 20 with another layer (homogeneously smooth for example).

Thanks to the programming of the means of displacement 107, it is possible to create on the surface of the layer, any other desired pattern. FIGS. 4b and 4c thus respectively represent a layer 20 with a grid pattern, and with a paved pattern, with a roughness lower than that of the rest of the surface of the layer.

And by controlling the number N of ions in the bombarded clusters in conjunction with the displacement of the layer 20, it is thus possible to create any pattern, including with several levels of roughness selectively distributed over different desired regions of the surface of the layer.

It is then possible to create patterns with variable roughness, to constitute detachable substrates whose distribution of roughness over the surface is perfectly controlled.

The expression "pattern with variable roughness" designates a pattern of which different zones may have different roughness.

It is to be noted that the implementation of the invention thus allows for the very fine controlling of the levels and distributions of roughness on the surface of a layer from which a detachable substrate is to be created after the reversible bonding via molecular adhesion with another layer (whose roughness may have been adjusted if necessary).

It is also to be noted that the fact of proceeding with a bombardment with ion clusters only modifies the surface of the layer 20, no subsurface damage being engendered by such a bombardment. In this regard reference can be made to the article "Substrate smoothing using gas cluster ion beam processing" by Allen and al., Journal of Electronic Materials, Vol.30, N°7, 2001.

What is claimed is:

1. A method for treating a semiconductor material for subsequent bonding which comprises bombarding a surface of the semiconductor material with a beam containing a controlled number of ions in ion clusters to etch a pattern in the surface with the beam, wherein the number of ions is controlled to provide a desired roughness of the surface pattern to improve adhesion during subsequent bonding; and bonding the surface of the semiconductor material to a surface of a semiconductor substrate to form a detachable substrate structure.

2. The method of claim 1, wherein the ions comprise chemically inert species in relation to the semiconductor material.

3. The method of claim 2, wherein the semiconductor material is made of at least one of silicon or silicon carbide, and the ions are argon ions or nitrogen ions.

4. The method of claim 1, wherein the surface is bombarded with ions that are capable of chemically reacting with the semiconductor material.

5. The method of claim 4, wherein the ions are generated from a plasma.

6. The method of claim 5, wherein the surface layer and the plasma are Si and $SF_6$, SiC and $SF_6/O_2$, and $SF_6/O_2$, $SiO_2$ and $CHF_3/SF_6$, $Si_3N_4$ and $CHF_3/O_2/SF_6$, respectively.

7. The method of claim 1, wherein the number of ion clusters bombarding the surface is controlled to smooth the surface to a roughness value suitable for molecular bonding.

8. The method of claim 7, which further comprises controlling the number of ions bombarding the surface by controlling the pressure of an ion source that generates the ion clusters.

9. The method of claim 1, which further comprises controlling an acceleration voltage that is applied to the beam to control the speed of the ion clusters and the resulting etching of the surface.

10. The method of claim 1 which further comprises directing the ion clusters to selectively treat desired zones of the surface to create an adjusted pattern thereon.

11. The method of claim 1 which further comprises focusing the beam such that the ions, any monomer species of the ions, and the ion clusters are directed towards a portion of the surface of the semiconductor material to cause etching thereof.

12. The method of claim 11 which further comprises directing the beam of ion clusters to a selected impact site on the surface of the semiconductor material.

13. The method of claim 12, wherein the semiconductor material is moved to provide the desired pattern.

14. A method for treating a semiconductor material for subsequent bonding which comprises
bombarding a surface of the semiconductor material with a beam containing a controlled number of ions in ion clusters that is directed to is directed to a selected impact site on the surface of the semiconductor material to etch a pattern in the surface with the beam by moving the semiconductor material to provide the desired pattern, wherein the number of ions is controlled to provide a desired roughness of the surface pattern to improve adhesion during subsequent bonding, which further comprises creating an appropriate spatial pattern on the surface that has a different roughness in comparison to other portions of the surface.

15. The method of claim 14, wherein a plurality of patterns of variable roughness are created on the surface.

16. The method of claim 1, wherein the semiconductor material is one that is recycled after removal of a transfer layer.

17. A method for treating a semiconductor material for subsequent bonding which comprises bombarding a surface of the semiconductor material with a beam containing a controlled number of ion sin ion clusters to etch a pattern in the surface with the beam, wherein the number of ions is controlled to provide a desired roughness of the surface pattern to improve adhesion during subsequent bonding; and further wherein the semiconductor material includes at least one layer of a material that is different than the semiconductor material, with the layer providing the surface of the semiconductor material that is etched by the bombarding.

18. The method of claim 17, wherein the semiconductor material includes at least two layers of materials that are different than the semiconductor material, with the outermost layer providing the surface of the semiconductor material that is etched by the bombarding.

19. A method for treating a semiconductor material for subsequent bonding which comprises:
  bombarding a surface of the semiconductor material with a beam containing a controlled number of ions in ion clusters to etch a pattern in the surface with the beam, wherein the number of ions is controlled to provide a desired roughness of the surface pattern to improve adhesion during subsequent bonding; and
  controlling the number of ions bombarding the surface by controlling the pressure of an ion source that generates the ion clusters, or controlling an acceleration voltage that is applied to the beam to control the speed of the ion cluster and the resulting etching of the surface.

* * * * *

UNITED STATES PATENT AND TRADEMARK OFFICE
CERTIFICATE OF CORRECTION

PATENT NO. : 7,056,809 B2
APPLICATION NO. : 10/695938
DATED : June 6, 2006
INVENTOR(S) : Rayssac It is certified that error appears in the above-identified patent and that said Letters Patent is hereby corrected as shown below:

<u>Title Page</u>:
Item [57] ABSTRACT, delete the abstract in its entirety and substitute the attached copy of the abstract as filed on October 30, 2003.

<u>Column 1, line 5 through Column 10, line 4</u>:
Delete the specification in its entirety and substitute the attached copy of the specification as filed on October 30, 2003.

Signed and Sealed this

Third Day of October, 2006

JON W. DUDAS
*Director of the United States Patent and Trademark Office*

METHOD FOR ION TREATING A SEMICONDUCTOR MATERIAL FOR SUBSEQUENT BONDING

BACKGROUND ART

The invention generally relates to the treatment of materials, and in particular for treating a semiconductor material for subsequent bonding. The technique includes bombarding a surface of the semiconductor material with a beam containing a controlled number of ions in ion clusters. The beam etches a pattern in the surface, and the number of ions is controlled to provide a desired roughness of the surface pattern to improve adhesion during subsequent bonding. The invention may be applied to substrates for use in electronics, optics and optoelectronics.

Processes for manufacturing detachable substrates are known. Such processes use two layers of material, for example semiconductor materials such as silicon, to fabricate "detachable" substrates. The expression "detachable" substrate means a substrate that comprises two layers that have been bonded together, wherein the bonding is reversible so that it is possible to separate the two layers along their bonding interface. Detachable substrates thus include two layers integrally attached at a bonding interface. The cohesion energy between the two layers is controlled so that it is sufficiently great to guarantee good cohesion of the two layers forming the detachable substrate, even when the substrate is subject to thermal and/or mechanical treatments (for example, thermal treatments such as high temperature annealing, and mechanical treatments such as polishing the substrate surface). The cohesion energy is also sufficiently small so that the layers can be separated at a weakened zone formed between the two layers if desired (for example after the substrate has been subject to certain treatments). Typically the two layers of the detachable substrate are detached via a mechanical action, for example by use of an object such as a blade.

The term "bonding" in the context of the treatment of very thin layers means to put two layers into contact to create links, via molecular adhesion, between the bonded surfaces of the two layers. These links may typically be hydrogen links, and their development can be stimulated by pre-treating the layers that are to be bonded.

Pre-treatments applied prior to bonding can, for example, include a cleaning stage that consists of dipping the layers successively in an alkaline bath and then in an acid bath. The layers are dipped in an alkaline bath to develop the hydrophilic properties of the layers, by creating OH type links on the surface of the layers. The acid bath eliminates any contaminating elements (in particular metals) from the surface of the layers that may have been generated during previous treatments of the layers (and in particular the alkaline bath). Pre-treatment can also involve exposing the layers to a plasma, for example, or may include other known techniques.

The surface condition of the layers to be bonded is subject to very strict specifications, especially when the layers are to be used to manufacture substrates for electronics, optics or optoelectronics applications. It is thus common to have to meet roughness specifications which must not exceed a few Angstroms in rms value (root mean square).

Roughness is generally measured with an AFM (Atomic Force Microscope). This equipment can measure the roughness on a scanned surface by using the tip of the AFM, ranging from $1\times1$ $\mu m^2$ to $10\times10$ $\mu m^2$, and in rare cases from $50\times50$ $\mu m^2$, or even $100\times100$ $\mu m^2$. Since the surface condition of these layers are generally very smooth, bonding s accomplished by simply contacting the surfaces of the two layers together. In some cases, such bonding may be complemented by compressing the structure made of the two layers.

It is known to make detachable substrates by applying a surface condition adjustment treatment to the surface of at least one of the two layers to be bonded. Such a surface condition adjustment treatment consists of applying a "wet" etching treatment to the surface, which means using a liquid to attack the surface to adjust its roughness. For example, the surface to be treated may be an oxide, and the liquid may be hydrofluoric acid. The surface oxide may be in particular a silicon dioxide. Attacking the surface with a liquid permits one to modify the surface as desired, such as to increase its roughness to a desired level. For example, to modify the surface so that it can bond with another layer, but also allow for separation of the bond later via a mechanical action. The desired roughness (typically a roughness of about 5 Angstroms rms to make a detachable substrate) is achieved by controlling the length of time the surface is exposed to the liquid.

Thus, one of the known techniques to make detachable substrates involves attacking the surface of at least one layer with a liquid, in order to increase the roughness of this surface. An inconvenience of such methods is that some parts of the layer that should not be attacked may happen to be exposed to the liquid. Consequently, when only one side of a layer should be treated, the opposite side of the layer may happen to be attacked considerably by the liquid.

It is possible to protect certain parts of the layer during wet etching. For example, the parts could be covered with a protective element, for example a varnish. But this implies the use of specific and complex equipment. Moreover, such protective means do not necessarily make it possible to systematically prevent the liquid from attacking certain other parts (notably the lateral parts of the layer). In addition, implementing such protective means may require additional handling of the layers, and thus additional risks of damaging these layers (which may be extremely fragile, particularly in the case of thin layers as mentioned above).

Moreover, if the purpose is to control the spatial distribution of side regions of a layer whose roughness is to be adjusted via the known technique of wet etching, it is necessary to plan for relatively heavy and complex means and a complicated protocol in order to only etch the desired side regions. It is necessary to cover the side of the layer with a mask to form a spatial pattern which allows access to only the regions which are to be etched (positive mask), or prevents access to only regions which are to be protected from etching (negative mask). The layer to be etched and its mask are exposed to wet etching. It is then necessary to remove the mask. This is achieved via chemical products and/or via exposure to a plasma. Such means to remove the mask are likely to damage the surface of the layer, and/or leave some contaminating elements on the surface. These contaminating elements can in particular be hydrocarbons issued from the resin that formed the mask. The hydrocarbons then are an obstacle to bonding the layer via molecular adhesion. Consequently, manufacturing a detachable substrate from such a layer is difficult.

Thus, it appears that known solutions for making detachable substrates have limitations.

SUMMARY OF THE INVENTION

The invention relates to a method for treating a semiconductor material for subsequent bonding. The technique includes bombarding a surface of the semiconductor material with a beam containing a controlled number of ions in ion clusters. The beam etches a pattern in the surface, and the number of ions is controlled to provide a desired roughness of the surface pattern to improve adhesion during subsequent bonding.

In an advantageous embodiment, the method also includes bonding the surface layer of the semiconductor material to a second surface of a semiconductor substrate to form a detachable substrate structure. In a preferred implementation, the ions are of a chemically inert species in relation to the semiconductor material, and the semiconductor material may be made of at least one of silicon or silicon carbide, and the ions may be argon ions or nitrogen ions. In a variation, the surface is bombarded with ions that are capable of chemically reacting with the semiconductor material, and the ions may be generated from a plasma. When the ions are capable of reacting with the semiconductor material, the surface layer and the plasma may respectively be of Si and $SF_6$, SiC and $SF_6/O_2$, $SiO_2$ and $SF_6/O_2$, $SiO_2$ and $CHF_3/SF_6$, $Si_3N_4$ and $CHF_3/O_2/SF_6$.

In a beneficial implementation according to the invention, the number of ion clusters is controlled to smooth the surface to a roughness value suitable for molecular bonding. The number of ions may be controlled by controlling the pressure of an ion source that generates ion clusters. In addition, an acceleration voltage that is applied to the beam may be controlled to control the speed of the ion clusters which influences the etching of the surface. In a preferred embodiment the ion clusters are directed to selectively treat desired zones of the surface to create an adjusted pattern.

In another advantageous embodiment, the invention includes focusing the beam such that the ions, monomer species of the ions, and the ion clusters are directed towards the surface of the semiconductor material. Moreover, the beam of ion clusters may be directed to a selected impact site on the surface of the semiconductor material, and the semiconductor material may be moved to provide the desired pattern. An appropriate spatial pattern can thus be created on the surface layer having a different roughness in comparison to other portions of the surface. Furthermore, a plurality of patterns with variable roughness can be created on the surface.

Advantageously, according to the invention, the semiconductor material is one that is recycled after removal of a transfer layer. In addition, the semiconductor material may include at least one layer of a material that is different than the semiconductor material, with the outer surface of the layer being etched by the bombarding. Preferably, at least two layers of materials that are different than the semiconductor material can be provided, such as a buried layer and an insulating layer, with the outermost layer being the surface that is etched prior to bonding.

The present invention thus overcomes the limitations of the prior art, and further allows for precisely controlling the surface condition (and in particular the roughness) of a layer of semiconductor material that will be used to assemble a detachable substrate. In particular, the present invention permits fine adjustments of the roughness of the surface, and permits the selection of either increasing or reducing the roughness of the surface. Moreover, the invention permits local adjustments to be made to the surface of semiconductor material, and the adjustments can be made according to a predetermined spatial pattern, without being subject to the inconveniences associated with conventional treatment methods.

BRIEF DESCRIPTION OF THE DRAWINGS

Other aspects, purposes and advantages of the invention will become clear after reading the following detailed description with reference to the attached drawings, in which:

Figure 1 is a schematic diagram of an installation for bombarding a wafer with ion clusters according to the invention;

Figures 2a and 2b are graphs that represent the evolution of the roughness of a surface that has been bombarded with ion clusters, under different conditions according to the invention;

DETAILED DESCRIPTION OF THE PREFERRED EMBODIMENTS

Figure 3:
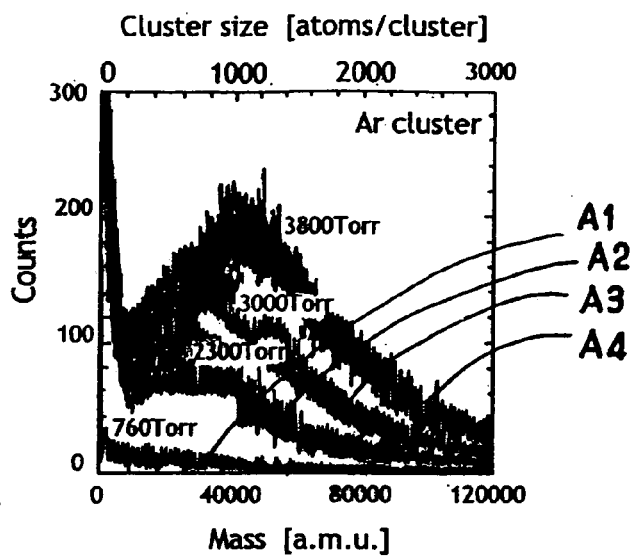
Figure 3 is a histogram illustrating the influence of pressure upon ion generation, in particular the creation of ion clusters.

Figure 1 illustrates an implementation of an installation 10 for bombarding a layer 20 of material with a beam 30 of ion clusters. The word "ions" may designate ions that are "pure", but also may designate species created from several ions and which are electrically charged. Generally speaking, the "clusters" as used herein, are globally ionized, meaning that they have an electric charge other than 0. But these clusters can further include ions of other species, including molecules.

The layer 20 is of a semiconductor material. As will be explained below, it can either be silicon or silicon carbide, or another semiconductor material ($SiO_2$ or $Si_3N_4$, for example).

The installation 10 comprises a source 101 of pressurized gas, capable of generating a parallel beam of gas ion clusters from a plasma internal to the source 101. The gas used can for example be argon or nitrogen. The control of the characteristics of the plasma allows for defining the configuration of the ion clusters. In particular, the pressure of the plasma source 101 is controlled in order to control the average number of ions present in the clusters, as will be explained in detail below with regard to Figure 3. In addition, control of the acceleration voltage allows for controlling the speed of these clusters.

The layer 20 is a layer whose surface conditions are to be modified in a controlled manner so that it can be assembled, via bonding, with another layer (whose surface condition may also have been adjusted) to create a detachable substrate.

According to a first alternate implementation, ion clusters such as those described above are projected onto the surface of the layer 20, and this bombardment includes no chemical reactions. In this case the bombardment is thus purely "ballistic", because the ion clusters are chemically inert in relation to the material of the layer 20. In such a case, the bombarded clusters are typically made of argon or nitrogen.

According to another alternative implementation, ion clusters of a particular species capable of chemically reacting with the material of the layer 20 could be used. In this case the bombardment is said to be reactive, and the bombarded ions can be made of oxygen or an oxygen compound.

In the case of a reactive bombardment of ions, it is also possible to further utilize an etching plasma (that is different from the plasma of the source 101) in a zone of the device 10 through which the ion beam will need to pass, and which is located in the region of the device 10 that is immediately upstream from the layer 20. In the particular embodiment including an etching plasma, it can for example be planned that the material of the surface of the layer 20 and the plasma element consist of one of the following pairs: (Si, $SF_6$), (SiC, $SF_6/O_2$), ($SiO_2$, $SF_6/O_2$), ($SiO_2$, $CHF_3/SF_6$), ($Si_3N_4$, $CHF_3/O_2/SF_6$). In this case, the ion clusters created by the source 101 chemically react with the etching plasma. In addition, the etching plasma itself can also chemically react with the surface of the layer, as well as the species having passed through the etching plasma with the layer.

Referring again to Figure 1, the installation 10 shows that the ion beam is generated by the source 101 and then passes through an accelerating chamber 102. The chamber 102 accelerates the ions clusters of the beam from the source 101 to a desired velocity, thanks to an acceleration electric voltage which can be controlled. In this text the "acceleration voltage" of the source 101 actually corresponds to the acceleration voltage of the accelerating chamber 102.

The beam then passes through a beam-creating electromagnetic structure 103. This structure 103 allows adjustments to the characteristics of the magnetic field of the beam (i.e. to collimate or focus the beam), via the application of electromagnetic fields with desired characteristics. The beam then passes through a magnetic annular structure 104 which also allows for the creation of a field with controlled characteristics, in order to selectively deviate the charged species of the ion beam. The beam issued from the accelerating chamber 102 and the electromagnetic structure 103 comprises ion clusters of the bombarded species, but also molecules which are electrically neutral (in particular monomers of the bombarded species). The trajectory of the different elements of the beam is represented in Figure 1 as being rectilinear. However, in reality these trajectories are not rectilinear, and the radius of curvature of the trajectory depends on the mass of the ions and of the different elements of the beam. By precisely controlling the characteristics of the magnetic field generated by the magnetic annular structure 104, it is possible to selectively deviate only the desired ion clusters towards the opening of a screen 106. The other constituents of the beam do not pass through this opening because they are stopped by the screen 106.

In a variation, the structure 103 and the structure 104 can be one and the same. In addition, an electrical neutralizing structure 105 may also be provided.

A screen 106 with an opening 1060 is positioned to let pass only the part of the beam that comprises the desired clusters, so that the desired ion clusters can have an impact on the layer 20 located behind the opening 1060. The screen 106 and its opening 1060 may be fixed parts of the device. The portion of the beam that passes through the opening to impact the layer 20 corresponds to a focalized beam, after the beam passes through of the means 103. Therefore, the layer 20 is impacted by the beam of ion clusters over a basic surface of very small dimensions (the section of the beam that passes through the opening 1060 has a width of about one or possibly only about a few millimeters). The layer 20 in this implementation is mounted on a movable support 107, which can be controlled to displace the layer 20 in the plane perpendicular to the beam, for example.

It is thus possible to precisely define an etching pattern of the ion clusters on the surface of the layer 20, by displacing the layer according to a desired trajectory using the moveable support 107. In this manner, the impact site of the ion clusters on the layer 20 traces a special pattern. This aspect will be further considered later.

Again referring to Figure 1, the installation 10 also includes a screened room 108 located behind the layer 20 and the displacement means 107, which faces the impact zone of the beam on the layer 20. This screened room 108 is connected to a device 109 capable of determining the dose of species received by the layer 20.

The bombardment of the layer 20 with ion clusters of desired characteristics thus allows for adjusting the roughness of the surface, with the aim of making a detachable substrate. It is to be noted that, in comparison with known techniques to modify the surface conditions via wet etching, the bombardment with ion clusters avoids the inconveniences described above. In particular, no "leak" or contamination can occur because the present technique modifies the surface roughness by using a "dry" etching technique, and not a "wet" etching method. Thus, the layer 20 does not come into contact with liquids.

Moreover, the present installation and method permits very precise control of the impact zone to be bombarded on the surface with the ion clusters. This is also true for the situation wherein the layer is not displaced, as the dimensions of the section of the beam that impact the layer are very small, as already mentioned. Further, the fact that the bombardment occurs not simply with ions but with clusters of ions, allows for great freedom to adjust the surface roughness of the layer 20. In particular, it is possible to selectively reduce, or increase, the surface roughness of the layer 20.

It has been observed that, depending on the characteristics of the bombardment with ion clusters, it is possible to either increase or reduce the roughness. In particular, with reference to Figure 2a, schematically represented are several curves C1 to C5 that are substantially rectilinear. These curves translate the evolution of the roughness R of the surface of the layer 20, versus the evolution of the voltage V applied to the beam inside the accelerating chamber 102. Each of the curves in Figure 2a corresponds to a bombardment condition in which the ion clusters mainly comprise a respective number of ions. The control of the bombardment parameters allows a determination of the number of ions present in the clusters that bombard the layer 20. The main parameter that controls the number of ions present in the clusters is the pressure inside the ion source 101. Thus, the pressure of the source 101 can be controlled to control the number of ions in the clusters. This is illustrated on the histogram in Figure 3.

Figure 3 shows several curves A1, A2, A3, A4. Each of these curves represents the size repartition of the ion clusters, for a given source pressure. The size of the clusters is represented by the number of atoms per cluster (upper horizontal scale), which here varies from 0 to 3000 atoms per cluster. The lower curve A1 is associated with a pressure of 760 Torr, the curve A2 with a pressure of 2300 Torr, the curve A3 with a pressure of 3000 Torr, and the curve A4 with a pressure of 3800 Torr. The peak of these curves. which corresponds to the most common cluster size for the pressure in question, has greater values as the pressure increases. This histogram was taken form the article entitled: "Materials processing by gas cluster ion beams", Material Science and Engineering, R34, N°6, p244 (2001). Thus, as shown, the number of ions present in each cluster lies around an average number "N" of ions per cluster. It is thus possible to control the value of N by controlling the pressure of the ion source.

Each curve in figure 2a thus corresponds to a different value of N. The value of N increases when the curve changes from C1 to C2, to C3, to C4, and to C5. The curve C1 corresponds to a bombardment with individual ions, which means that N equals 1. Under these conditions, as the acceleration voltage of the ions of the beam increases, the surface roughness of the layer 20 subject to bombardment of "clusters", each made of a single ion, increases considerably. In this situation, the ions individually bombard the layer and cause major damage to the surface structure of the layer.

The curve C2, immediately below the first curve, corresponds to bombardment conditions under which N has a value greater than 1. In this case the same increase in acceleration voltage does not result in as great an increase of the surface roughness, even though the roughness does increase. The next curve C3 illustrates a low increase of roughness for the same increase in the voltage V. Lastly, the curve C4 corresponds to bombardment conditions under which the bombarded clusters comprise a rather large number of ions, and it illustrates a constant roughness despite the increase in the acceleration voltage V.

Thus, when the ion clusters comprise a number N of ions greater than a given threshold, the slope of the resulting curves Rf(V) approaches zero, under certain conditions. This threshold depends on the starting surface condition of the layer, prior to bombardment. Moreover, when the number N continues to increase, bombardment does not increase the surface roughness of the layer 20, but rather reduces it by smoothing this surface. This situation is illustrated by the curve C5.

By adjusting bombardment conditions, and more precisely the number of ions present in the clusters, it is possible to adjust the surface condition of the layer 20 in a desired manner by increasing to a greater or lesser extent the surface roughness of this layer, or even by reducing the roughness. This is useful in cases where the surface of the layer 20 has a high roughness before bombardment.

Consequently, two parameters define bombardment conditions that have a major influence on the progression of the process. First, the pressure associated with generating ions allows one to control the number of ions present in the clusters. Second, the acceleration voltage allows one to control the speed of the clusters, and also has an influence as described with reference to Figures 2a and 2b. This influence can be exploited by programming bombardment sequences during which different regions of the layer 20 are subject to cluster bombardments of different numbers of ions, to selectively adjust the surface roughness of the different regions in a desired manner. For this purpose, the means of displacement 107may advantageously be programmed to displace the layer 20 in conjunction with changes to the parameters to modify the value of N during different successive stages of a given bombardment process of the layer.

Figure 2b represents the evolving surface roughness R of the layer 20 subject to bombardment with ion clusters that includes an average number N of ions which can vary (here again corresponding to different curves in this figure), versus the acceleration voltage V. This Figure includes the curves C1 to C5 of Figure 2a. However, Figure 2b also shows another set of curves C'1 to C'5, which progress according to the same general logic as the curves C1 to C5 (increase in the number N from curve C'1 to curve C'5, for the same starting layer 20 and the same bombarded ions).

The curves C'1 to C'5 show that, contrary to the curves C1 to C5, an increase in the number N does not result in a reduction of the surface roughness of the layer 20. The curve C'5 corresponds to a number N that is very large, which can be associated with a value of N that approaches infinity. It should be noted that when the surface condition of the layer 20 already corresponds to a low roughness (curves C'1 to C'5), it is impossible to further smooth the surface by increasing N. Thus, starting with a layer whose surface is relatively rough, it is possible to selectively increase, or reduce, the roughness.

An interesting application of the present method is when a surface layer 20 of a wafer has surface conditions that are incompatible with bonding via molecular adhesion (roughness greater than a value of about 5 Angstroms rms). The present invention can be used to advantageously treat certain regions of these wafers to smooth them and bring these regions to a roughness value that enables such bonding. In particular, this allows for the recycling of donor wafers resulting from use of a layer transfer process such as the SMART-CUT® type process, by reusing them. In this case, it is possible to use layers made from a wafer whose intrinsic surface condition is incompatible with bonding (for example, SiC, III-V). Instead of proceeding to completely polish such a wafer, a bombardment with clusters comprising a rather large number N of ions makes it possible to smooth the surface of the wafer.

Moreover, the smoothing process can be precisely controlled, both in terms of the final roughness and in terms of creating a spatial pattern having more or less smooth regions with the aim of using the surface for bonding. However, if the starting surface condition of the layer 20 is inferior (less than a given threshold $R_0$), which depends among other things on the nature of the material of the layer and of the bombarded species, it will only be possible to increase the roughness. Thus, if the starting point of the curves C'1 to C'5 happened to be below the threshold $R_0$ (whereas it is situated at the level of this threshold in Figure 2b), it would not even be possible to retain this starting low roughness by proceeding with a bombardment of the surface. In particular, even a bombardment with a very great value of N would result in an increase of the roughness.

Figures 4A, 4B:
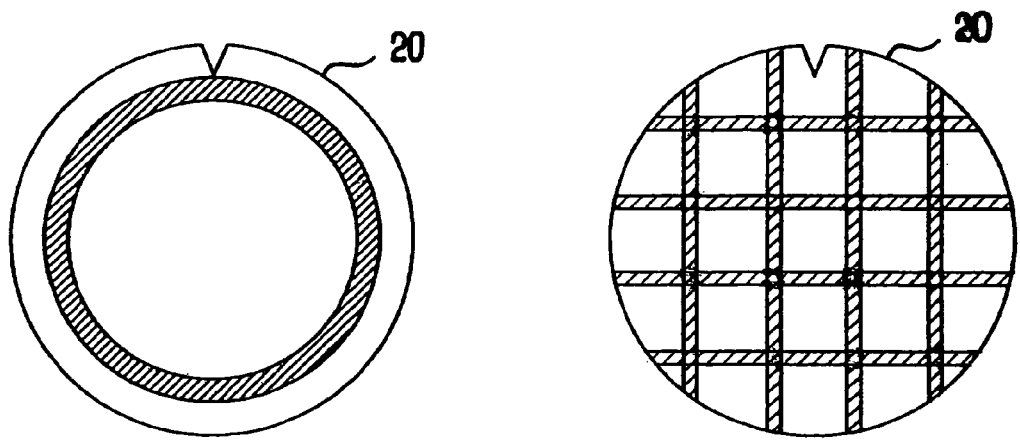
Figures 4a to 4c illustrate a particular implementation of the invention, in which a surface is selectively and locally treated to adjust its surface condition according to a desired pattern.
Figure 4C:
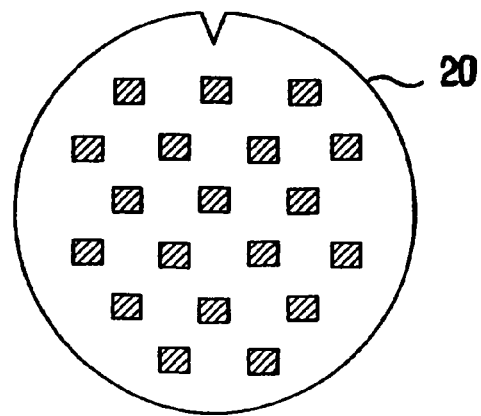

Figures 4a to 4c represent layers 20 that have been subject to a bombardment with ion clusters such as that described above, during which the roughness of certain regions of the surface of the layer have been selectively modified. Figure 4a shows a ring on the surface which has been created to have a roughness value lower than that of the rest of the surface, so that mechanical stability can be obtained on this ring when at the time of assembling the layer 20 with another layer (which may be homogeneously smooth, for example).

The displacement device 107 may be programmed to create any other desired pattern on the surface. Figures 4b and 4c thus respectively represent a layer 20 with a grid pattern, and with a paved pattern, each having a roughness lower than that of the rest of the surface of the layer. Further, by controlling the number N of ions in the bombarded clusters in conjunction with the displacement of the layer 20, it is thus possible to create any pattern, including one with several levels of roughness selectively distributed over different desired regions of the surface. It is then possible to create patterns with variable roughness, to make detachable substrates having a controlled distribution of roughness over the surface. The expression "pattern with variable roughness" designates a pattern wherein different zones may have different roughness values.

It is to be noted that the present technique allows for the very fine control of the levels and distributions of roughness on the surface of a layer from which a detachable substrate is to be created, after conducting a reversible bonding process via molecular adhesion with another layer (whose roughness may have been adjusted if necessary).

It is also noted that proceeding with a bombardment with ion clusters only modifies the surface of the layer 20, no subsurface damage occurs by using such a bombardment process. In this regard reference can be made to the article "Substrate smoothing using gas cluster ion beam processing" by Allen et al., Journal of Electronic Materials, Vol. 30, N°7, 2001.

METHOD FOR ION TREATING A SEMICONDUCTOR
MATERIAL FOR SUBSEQUENT BONDING

ABSTRACT

A method for treating a semiconductor material for subsequent bonding. The technique includes bombarding a surface of the semiconductor material with a beam containing a controlled number of ions in ion clusters. The beam etches a pattern in the surface, and the number of ions is controlled to provide a desired roughness of the surface pattern to improve adhesion during subsequent bonding.

UNITED STATES PATENT AND TRADEMARK OFFICE
CERTIFICATE OF CORRECTION

| | |
|---|---|
| PATENT NO. | : 7,056,809 B2 |
| APPLICATION NO. | : 10/695938 |
| DATED | : June 6, 2006 |
| INVENTOR(S) | : Rayssac |

Page 1 of 1

It is certified that error appears in the above-identified patent and that said Letters Patent is hereby corrected as shown below:

Column 10:
Line 28 (claim 6, line 2), after "the plasma are Si and $SF_6$, SiC and $SF_6/O_2$," insert -- $SiO_2$ --.
Line 58 (claim 14, line 5), after "clusters that is directed to" delete "is directed to".

Column 11:
Line 9 (claim 17, line 4), after "controlled number of" delete "ion sin" and insert -- ions in --.

Signed and Sealed this

Twenty-seventh Day of March, 2007

JON W. DUDAS
*Director of the United States Patent and Trademark Office*